United States Patent [19]

Linnenbrink et al.

[11] Patent Number: 5,061,927
[45] Date of Patent: Oct. 29, 1991

[54] FLOATING POINT ANALOG TO DIGITAL CONVERTER

[75] Inventors: Thomas E. Linnenbrink, Monument; Stephen D. Gaalema, Black Forest, both of Colo.

[73] Assignee: Q-Dot, Inc., Colorado Springs, Colo.

[21] Appl. No.: 560,949

[22] Filed: Jul. 31, 1990

[51] Int. Cl.⁵ .................. H03M 1/18; H03M 1/58
[52] U.S. Cl. ............................. 341/138; 341/140; 341/155; 341/172; 341/139
[58] Field of Search ............. 341/138, 139, 140, 172, 341/155

[56] References Cited

U.S. PATENT DOCUMENTS

| | | | |
|---|---|---|---|
| 3,685,046 | 8/1972 | Howlett | 341/139 |
| 3,872,465 | 3/1975 | Loofbourrow | 341/139 |
| 4,010,462 | 3/1977 | Armistead | 341/139 |
| 4,048,635 | 9/1977 | Bich | 341/139 |
| 4,392,124 | 7/1983 | Benoit-Gonin et al. | 341/172 X |
| 4,399,416 | 8/1983 | Gillespie | 341/139 X |

*Primary Examiner*—J. R. Scott
*Assistant Examiner*—Sharon D. Logan
*Attorney, Agent, or Firm*—Welsh & Katz, Ltd.

[57] ABSTRACT

A floating point analog to digital converter having an exponent converter which divides the input signal successively one-half until the divided signal is within the range of a mantissa linear analog to digital converter. The exponent converter also generate a digital exponent representative of the division factor. The resulting divided signal is then digitized by the mantissa analog to digital converter. An output is thereby provided composed of a digital exponent and a digital mantissa. In one embodiment, the floating point converter is a charge mode converter suitable for direct interface to a charge mode device such as a CCD image sensor.

14 Claims, 4 Drawing Sheets

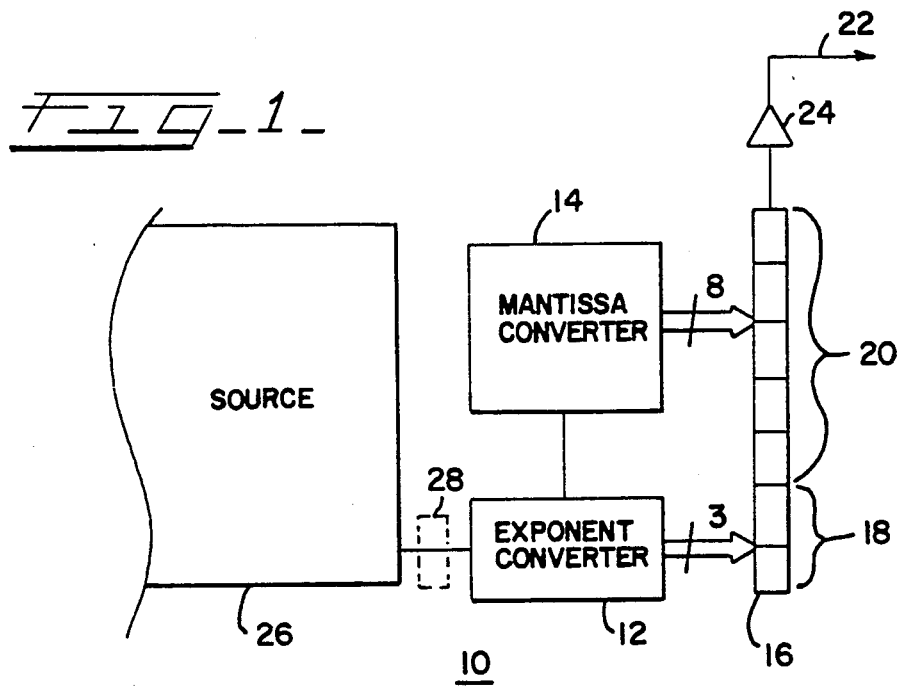
FIG-1-
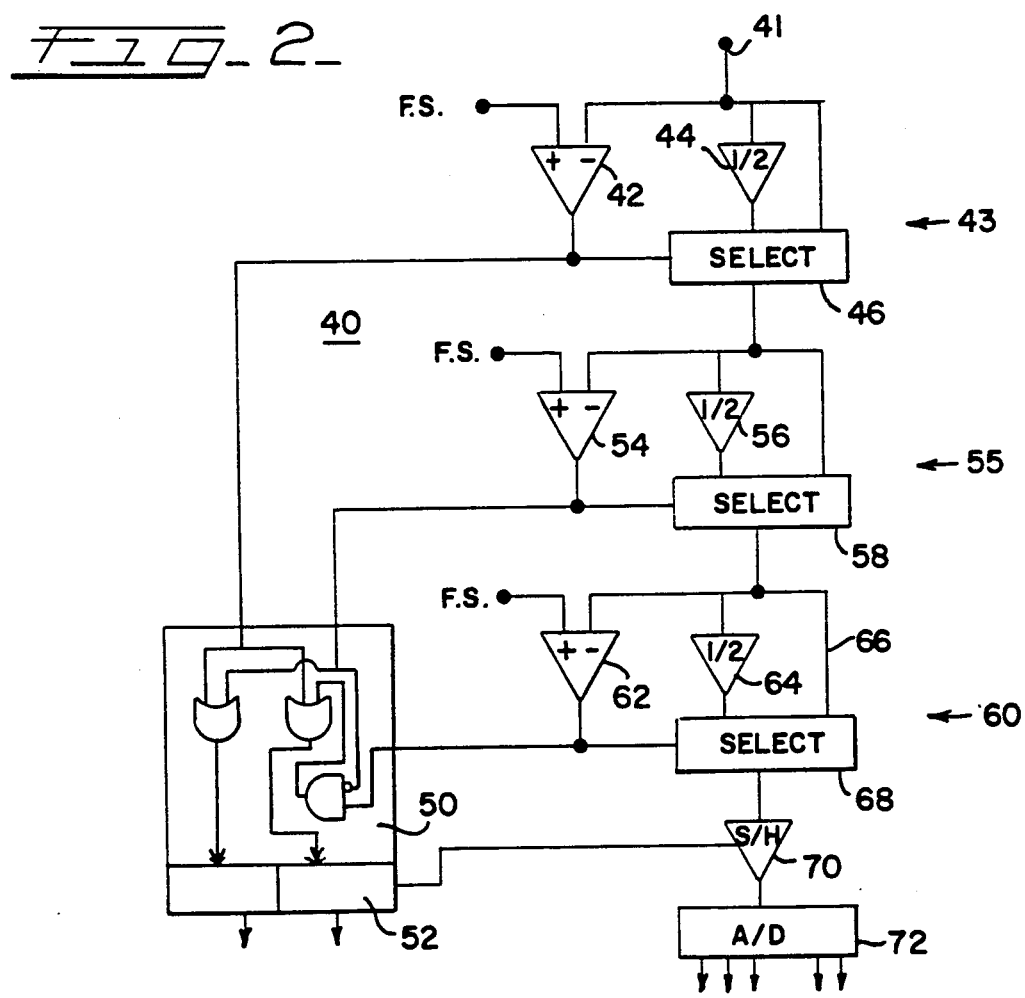
FIG-2-

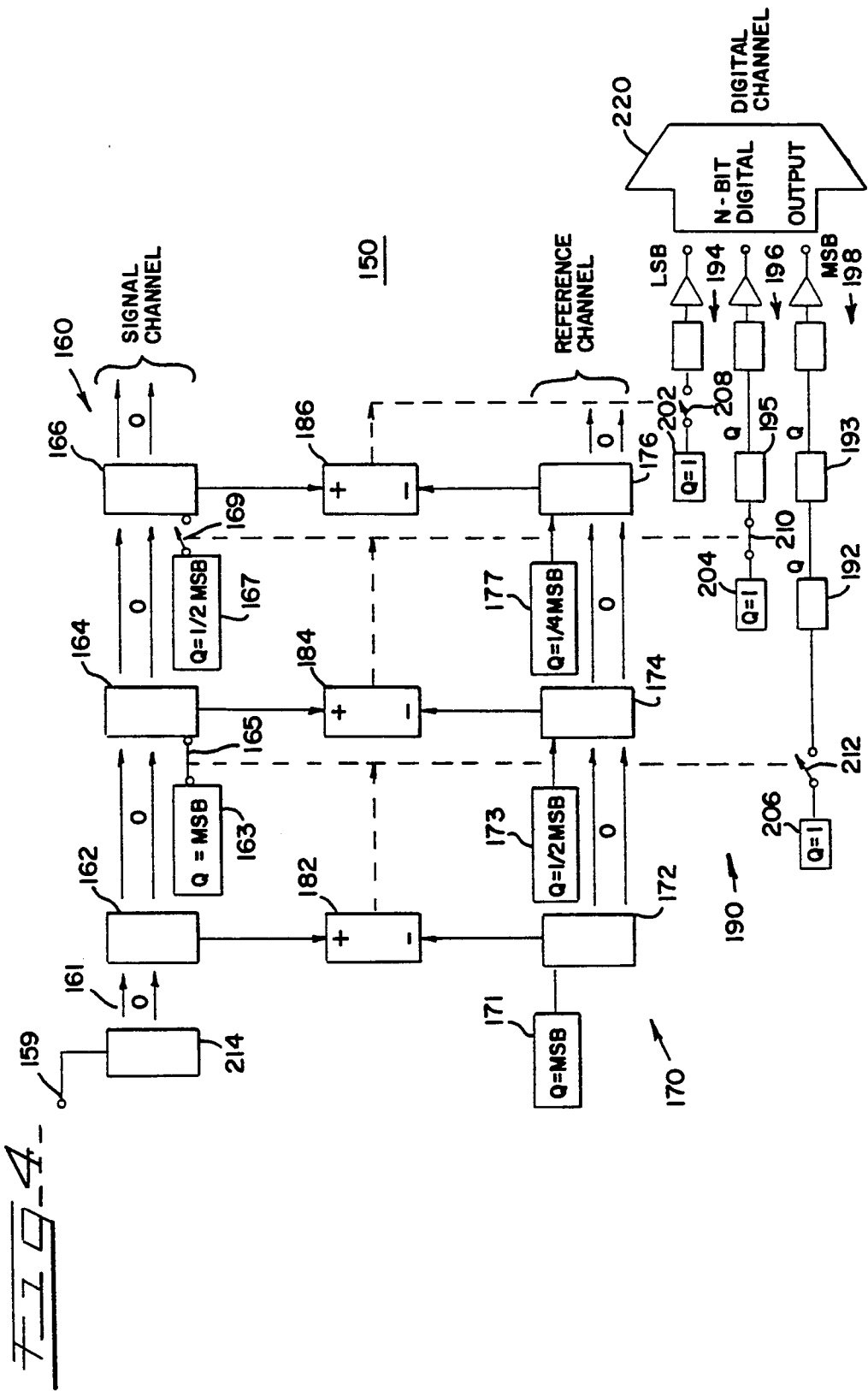

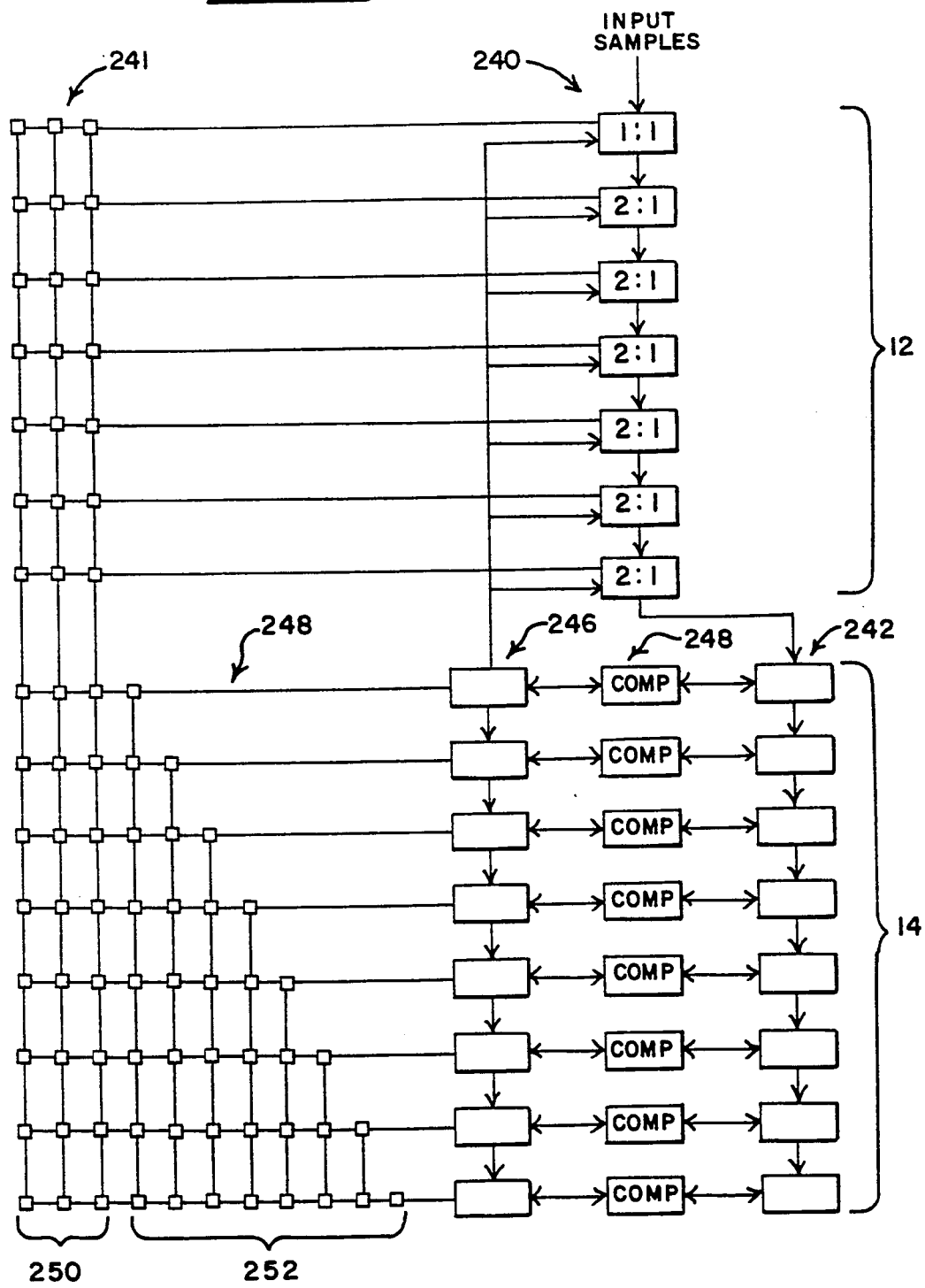

FLOATING POINT ANALOG TO DIGITAL CONVERTER

This invention relates generally to the field of analog to digital converters and particularly to an improved floating point digital converter suitable for integration with analog sensors.

Analog to digital (A/D) converters are well known in the art for converting analog signals to a digital representation of the signal primarily to permit digital processing, digital storage, and/or digital display of the signal. One known type of A/D converter is a floating point A/D converter. This type of A/D converter can provide a high resolution with wider dynamic range than comparable conventional linear A/D converters. In conventional linear A/D converters the measurement resolution is fixed by the size of the converters least significant bit (LSB), which depends upon the ratio of the devices full scale range and the number of bits it can resolve. To measure signals with wide dynamic range, the LSB size can be reduced by increasing the number of bits of resolution, however, this results in increased conversion time, increased power consumption, and increased circuit complexity because of the increase in the number of bit decisions and the time required for the internal signals to settle sufficiently to guarantee a correct decision.

In many cases, however, very small changes in the input signal need to be resolved only when the signal is small. As the signal increases, the absolute measurement accuracy may be reduced without losing significant information. A floating point A/D converter, wherein the LSB weight varies in response to the input signal, will satisfy this requirement and bypass the resolution/throughput barrier of conventional A/D converters.

In one prior art floating point A/D converter, the LSB size is changed by factors of two by using a programmable gain amplifier ahead of the A/D converter. A nearly full scale input is passed through with unity gain, and an input slightly below half scale might see a gain of two, etc., making the effective LSB smaller as the signal decreases in magnitude thereby increasing the overall measurement resolution for signal inputs. Because of the binary weighing of gain, this amounts to moving the binary point of the A/D converter output word, hence "floating point." The input can be reconstructed using the A/D converter's output code and the gain value used to obtain that result. Such prior art floating point A/D converters require complex and power consuming circuitry and have limited accuracy due to the difficulty of obtaining accurate linear programmable gain amplification. In addition, many analog sensors are charge mode sensors which provide an output which is in the form of charge packets (i.e. samples). The prior art floating point converters used with these charge mode devices require an additional charge to voltage converter to interface to such devices introducing additional error and power consumption.

Accordingly, it is an object of the invention to provide a novel floating point A/D converter with high accuracy, low power consumption, high speed and small size suitable for integration with other circuits on a single monolithic substrate.

It is another object of the invention to provide a novel charge mode floating point A/D converter having a novel charge mode exponent converter suitable for direct interfacing to charge mode analog devices.

It is another object of the invention to provide a novel charge mode floating point A/D converter having a novel charge mode linear mantissa A/D converter.

Briefly, according to one embodiment of the invention, a floating point analog to digital converter is provided having an exponent converter for dividing an input signal by a division factor selected responsive to the magnitude of the input signal to generate a divided signal and for generating a digital exponent representative of the division factor. A linear A/D converter is provided as a mantissa converter to convert the divided signal to an output digital signal and an output means is provided for outputting both the output digital signal and the digital exponent. In an alternative embodiment the exponent converter means is a charge mode circuit suitable for direct interface to charge mode devices. In another embodiment both the exponent converter and the linear mantissa A/D converter are charge mode devices.

A BRIEF DESCRIPTION OF THE DRAWINGS

The invention, together with further objects and advantages thereof, may be understood by reference to the following description taken in conjunction with the accompanying drawings.

FIG. 1 is a general block diagram illustrating the overall operation of the floating point A/D converter according to the invention.

FIG. 2 is a block diagram illustrating a specific embodiment of the exponent converter shown in FIG. 1.

FIG. 4 is a detailed block diagram illustrating a specific embodiment of a charge mode linear A/D converter suitable for use on a mantissa converter in accordance with the invention.

FIG. 5 is a detailed block diagram of a specific embodiment of a charge mode floating point A/D converter according to the invention.

DETAILED DESCRIPTION OF THE INVENTION

Figure 3:
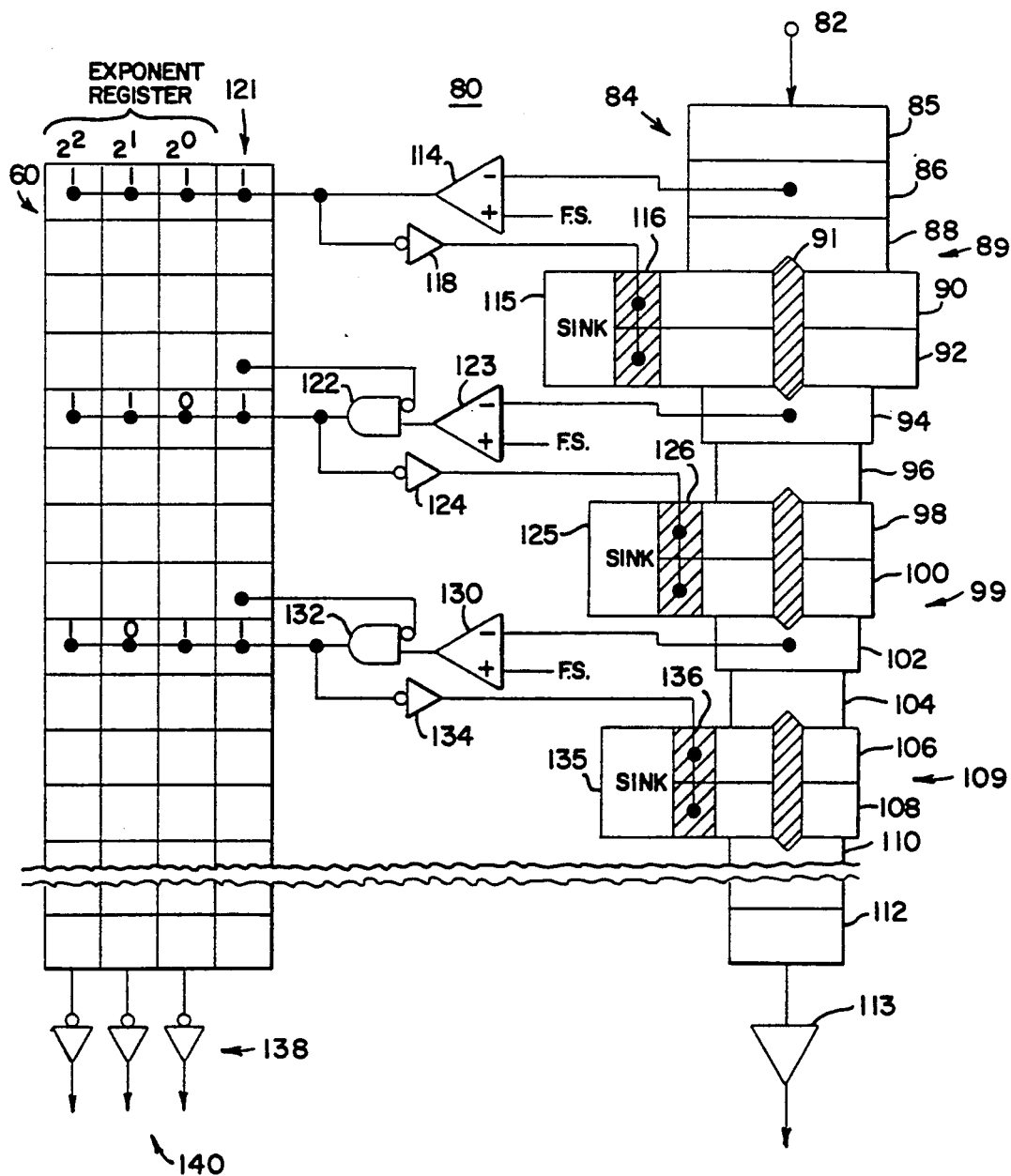
FIG. 3 is a detailed illustration of a charge mode exponent converter.

FIG. 1 is a generalized block diagram illustrating a floating point A/D converter (e.g. eleven bit) comprising an exponent converter 12 (e.g. three bit) coupled to a mantissa converter 14 (e.g. eight bit) each coupled to an output register 16. The output register 16 includes an exponent register 18 coupled to the exponent converter 12 and a mantissa register 20 coupled to the mantissa converter 14. The output register 16, as shown, may be a conventional serial register (e.g. a shift register) with a serial output 22 coupled through an output amplifier 24 or may be a parallel register using a parallel output (not shown). A sampled input signal is coupled from an analog signal source 26 to the exponent converter 12, as shown. The analog signal source 26 may be any source of analog signal (including sampled analog) such as a sensor.

The analog signal is scaled (i.e. amplified or divided by a selected factor) in the exponent converter 12 to provide a scaled analog output which is coupled to the mantissa converter 14, and a digital exponent output, representative of the amount of scaling of the analog signal, is coupled to and temporarily stored in the exponent register 16. The amount of scaling performed by the exponent converter is determined by sensing the level of the input signal and determining the desired amount of scaling from the level of the input signal. The scaled analog signal is coupled to the mantissa converter 14 to be digitized thereby providing a digital representation (in the illustrated embodiment eight bits) of the scaled analog signal which is coupled to and temporarily stored in the mantissa register 20, as shown. The mantissa converter 14 may be any A/D converter such as are well known in the art. Typically a linear A/D converter is utilized although a non-linear converter may also be suitable.

If the signal source is a charge mode device, such as a CCD image sensor, the output of such a device will be of the form of a sampled analog signal, i.e. a packet of charge. Such sampled analog signals are discrete in time and continuous in amplitude. To convert such a signal, an analog exponent converter may provide conversion of the sampled analog signal by first converting the signal to a conventional analog signal by means of an optional conventional charge mode to analog signal converter 28 such as are well known in the art (e.g. a sampled charge to voltage converter). The resulting converted analog signal can then be converted by the exponent converter 12. This however requires additional circuitry with a potential decrease in accuracy and power efficiency. A charge mode to analog signal converter circuit can be avoided by utilizing a charge mode exponent converter 12 which can be coupled directly to a charge mode signal source. To avoid the need for similar charge mode to analog conversion in the exponent converter, the mantissa converter 14 may also be a charge mode circuit. Alternatively, the exponent converter 12 may be analog and the mantissa converter 14 may be a charge mode converter with an analog to charge mode converter used to couple the signal from the exponent converter 12 to the mantissa converter 14.

In operation, the input signal is coupled to the floating point converter 10 at the input to the exponent converter 12 which will scale the input signal by first sensing the input signal value. Thus, in a dividing embodiment of the exponent converter 12, the input is divided by two if it is larger than full scale value of the mantissa A/D converter 14. If the halved signal is still larger than the mantissa A/D converter 14 full scale value then it is halved again. This process is repeated until the signal is within the range of the mantissa A/D converter 14 (unless the signal is too large for the number of dividers in the circuit, in which case an overflow occurs). The resulting divided signal is coupled to the mantissa A/D converter 14 and converted to digital form. Both the digitized signal and a digital exponent representative of the number of times the signal was divided are output to the digital output of the floating point converter 10. In the illustrated embodiment, this results in an eleven bit floating point number with a three bit exponent and an eight bit mantissa. This operation results in an increase in the dynamic range of the mantissa (i.e. doubling of the dynamic range for each increase of the exponent) with a corresponding decrease (i.e. halving) of the sensitivity of the mantissa converter 14.

Referring now to FIG. 2 there is shown a detailed block diagram illustrating an analog dividing exponent converter 40 having an input 41 which is coupled as shown, to a comparator 42, a signal magnitude divider 44 (e.g. voltage divider network, amplifier with gain of one half, etc.), and a selection circuit 46 (e.g. a conventional analog switch). The magnitude dividers in the illustrated embodiment reduce the signal by one half although other factors can be used (e.g. one-fourth, $1/\pi$, $1/e$, etc.). The comparator 42, divider 44, and selection circuit 46 comprise a sense and divide stage 43. The output of the magnitude divider 44 is coupled to the selection circuit 46 and the comparator 42 is coupled to a select control input of the selection circuit 46 and to an exponent logic 50 which includes an exponent register 52.

The output of the selection circuit 46 is coupled to a comparator 54, a magnitude divider 56, and a selection circuit 58 of another sense and divide stage 55, as shown. The output of the comparator 54 is coupled to the exponent logic 50 and to the selection circuit 58 while the output of the magnitude divider 56 is coupled to the selection circuit 58. The output of the selection circuit 58 is coupled to a comparator 62, a magnitude divider 64, and a selection circuit 68 of the next sense and divide stage 60. The output of the magnitude divider 64 is coupled to the selection circuit 68, and the output of the comparator 62 is coupled to the selection circuit 68 and to the exponent logic 50, as shown. Only three sense and divide stages 43, 55, 60 are shown (using a two bit exponent), however, additional stages may be added to obtain additional increase in dynamic range (for example, using six stages would provide a dynamic increase of $2^7$). The output of the selection circuit 68 is coupled to a sample and hold circuit 70 which is coupled, as shown, to a mantissa A/D converter 72 and to the exponent register 52. The sample and hold circuit 70 and the mantissa A/D converter 72 may be conventional circuits such as are well known in the art.

In operation, an input signal (voltage, current, charge, etc.) is coupled to the input 41 of the exponent converter 40, the magnitude of the input signal is compared to the full scale magnitude of the mantissa A/D converter 72 by the comparator 42. If the input is larger than the full scale than a low output from the comparator 42 causes the selection circuit to select the output of the magnitude divider 44 and couple it to the next sense and divide stage 55. If the input is less than the full scale value the comparator 42 output will be high and will result in coupling of the undivided signal by the selection circuit 46 to the next sense and divide stage 55. If the undivided signal is passed then it will also be passed undivided by the following stages. If the divided signal is passed, then the next stage and each subsequent stage will repeat the above process to produce a scaled signal which is then sampled and held by the sample and hold circuit 70 for digitization by the mantissa A/D converter 72.

The output of each comparator 42, 54, 62 is coupled to the exponent logic 50. The exponent logic 50 is a conventional three line to two bit encoder (e.g. a gate network) which converts the combination of the comparator outputs to a digital exponent. In the illustrated embodiment, the gate network comprises two OR-gates, an inverter and an AND gate configured to provide a two bit exponent with preselected binary encoding (i.e. 11→undivided signal; 10→divided by 2; 01→divided by 4 and 00→divided by 8). The resulting exponent is latched into the exponent register 52 in conjunction with the sample and hold operation of the sample and hold circuit 70. The resulting exponent and the mantissa may then be output, for example, to an output register as illustrated in FIG. 1.

FIG. 3 is a detailed diagrammatic illustration of a charge mode exponent converter 80 using pipelined charge scaling. An input port 82 couples an input charge packet (i.e. sample) to a sampling input charge well 85. The charge well 85 is an input charge well of a conventional charge coupled device (CCD) channel 84 composed of a series of intercoupled charge wells 85 to 112 among which are charge splitting wells 90, 92, 98, 100, 106, 108 (i.e. charge scaling elements) and charge sinks 115, 125, 135, as shown. The output charge well 112 of the CCD channel 84 is coupled to a sample and hold circuit 113, as shown. The output of the sample and hold may then be coupled to a mantissa A/D converter, as illustrated in FIG. 1.

A charge to voltage latching comparator 114 is coupled to the second charge well 86, and has an output coupled to an exponent register array 120 which includes an inhibit bit column 121. The comparator 114 is also connected to a sink control 116 of charge splitting wells 90, 92 through an inverter 118, as shown. This structure comprises a sense and divide stage 89. Similarly, a charge to voltage latching comparator 123 is coupled to the charge well 84 and has an output coupled through an AND gate 122 to the exponent register array 120 and through an invertor 124 to a sink control 126 of splitting charge wells 98, 100 to form a sense and divide stage 99, as shown. A charge to voltage latching converter 130 is shown coupled to the charge well 102 having an output coupled through an AND gate 132 to the exponent register array 120 and through an invertor 134 to a sink control 136 of splitting charges wells 106, 108 to form another sense and divide stage 109. As illustrated, this structure may be repeated to provide additional sense and divide stages and thus greater dynamic range. This inhibit bit 121 of the exponent register array 120 is coupled to an input of the AND gates 122, 132, which may include a latch. In addition, the exponent array 120 is coupled to an output 140 via a set of driver amplifiers 138.

The CCD channel 84 of the illustrated embodiment is a conventional CCD structure such as are well known in the art. In such CCD circuits, each charge well is clocked by a clock signal such that a charge packet or sample in the charge well is coupled (i.e. passed on) to the next charge well. This process is typically repeated to move a charge packet from one end of the CCD channel to the other. The exponent register array 120, in the illustrated embodiment is a set of conventional shift registers formed in four columns configured to be clocked by the same clock signal as the CCD channel. Thus, the data loaded in the top locations (i.e. the first position at the top of each of the four columns) is serially clocked down the columns one location for each clock cycle in synchronization with the clocking of the corresponding charge packet in the CCD channel 84. The inhibit bit column provides a inhibit bit which is coupled to the AND gates 122, 132 to inhibit operation of the divide function when required.

In operation, an input charge packet is coupled to the input 82 of the charge mode exponent converter 80 from a charge mode source device or analog to charge mode converter 28. This charge packet is coupled into the sampling charge well 85 and subsequently into the charge well 86 on the next clock cycle. The charge in the charge well 86 is coupled to the comparator 114 which converts the charge level to voltage and compares the result to the full scale (FS) input limit of the mantissa A/D converter 14. If the input is larger than the full scale reference the comparator output is latched low and no action is performed in the exponent register in the first location. If the charge level is less than full scale, then the output of the comparator 114 is latched high setting the first location of the exponent register to ones including the inhibit bit, as shown. On the next clock cycle, the charge is coupled to the charge well 86 and the data in the exponent register is shifted to the next position. On the next clock pulse the charge is coupled to the splitting charge well 90 such that half of the charge goes to the right half of the well and the other half of the charge goes to the left half of the well as a result of the splitting structure 91. Other division factors could also be used. If the signal on the sink control 116 from the comparator 114 is high (due to the input signal being larger than full scale) the charge of the left side of the splitting charge well 90 will be discarded to the sink 115. On the next clock cycle, the charge will be coupled to the next splitting charge well 92, which insures that all the charge in the left half has been discarded. If the signal on the sink control input 116 is low (i.e. the input signal is within full scale) both halves of the charge will be retained.

On the next clock cycle, the remaining charge (i.e. all or half) will be coupled to the next charge well 94 which will recombine to obtain the original charge packet if both charge halves have been retained or only half the original charge if half has been discarded. Correspondingly, the data in the exponent register array 120 will progress in synchronization with the charge packet (i.e. as the charge moves down the CCD channel 84, the exponent and inhibit signal is shifted down with it in the exponent array 120). Thus, when the sense and divide process is completed in the first sense and divide stage 89, the charge and data are transferred to the next stage 99 leaving the first stage ready to accept and operate on the next input charge packet (i.e. every fourth clock cycles). This pipeline operation permits high speed operation.

The operation of the subsequent illustrated stages 99, 109, and any additional stages is identical to the first stage except that if splitting by a subsequent stage is required, the comparator 123, 130 loads different exponent values into the register to represent the factor of scaling (i.e. division in the illustrated embodiment). In addition, if no division is performed by a stage, the inhibit bit will be set to one so that the next stages are all inhibited from further division and from corrupting the exponent. Thus, the AND gates 122, 132 are disabled when the inhibit bit is set to one by the previous stage which thereby prevents the comparators from setting exponent data or causing the sinks to discharge. As a result, the full charge and the exponent remain intact. When the charge and exponent have moved down the entire corresponding channel, the exponent is coupled to the output amplifier 138 and the charge is coupled directly to an output or through the sample and hold amplifier 113, as shown.

The charge mode exponent converter 80 of FIG. 3 may also function in a scale-up mode in which each charge scaling element (i.e. each charge splitter) is replaced by charge replicators which increase the charge by a fixed factor, for example, a factor of two. Thus, at each stage 89, 99, 109 the charge is either doubled if the incoming charge was less than one half the full scale value, or passed intact if larger, and the exponent is generated accordingly.

A specific embodiment of the exponent converter of FIG. 3 was fabricated by the applicants with eight sense and divide stages. The converter was fabricated with a surface CCD channel with a total active area of approximately ⅓ mm wherein the first charge well had dimensions of approximately 167 microns by 24 microns with subsequent charge cells tapering down to the last charge well having dimensions of twenty microns by six microns. The charge capacity of the first charge well was approximately $4 \times 10^7$ electrons with the charge capacity of charge wells of each subsequent stage decreasing such that the charge capacity of the last charge well was $3 \times 10^5$ electrons. The converter was operated at a sample shift rate of 10K samples per second using a four phase clock with a 5 v peak to peak clock signal.

Referring now to FIG. 4 there is shown a diagrammatic illustration of a basic architecture of a specific embodiment of a pipelined, charge mode linear A/D converter 150 which may be used independently as an A/D converter or as a charge mode mantissa converter for the structure of FIG. 1. The converter 150 comprises a signal channel composed of a clocked, pipelined CCD signal channel 160 composed of charge wells 162, 164, 166, and a corresponding reference CCD channel 170 composed of charge wells 172, 174, 176. These CCD channels are formed using conventional CCD structures and conventional CCD fabrication techniques such as are well known in the art. Each charge well is coupled to a corresponding charge to voltage latching comparator 182, 184, 186. Charge wells 162, 172 are coupled to the latching comparator 184 to form a first stage, charge wells 164, 174 are coupled to the latching comparator 184 to form a second stage, and charge wells 166, 176 are coupled to the latching comparator 186 to form a third stage, as shown. As indicated, although only three stages are shown, this structure may be repeated to provide any number of stages to obtain any desired number of bits of digital output.

In the second stage, a charge injection circuit 163 for injecting a charge (Q) equal to the most significant bit (MSB) of charge (i.e. one half the full scale charge value) is coupled through a switch 165 to the charge well 164. The switch 165 is coupled to and controlled by the comparator 182, as shown. Similarly, a charge injecting circuit 167 for injecting a charge equal to one half the MSB of charge is coupled through a switch 169 to the charge well 166. The switch 169 is coupled to and controlled by the comparator 184. In subsequent stages the same structure would be provided with the injected charge values decreasing by one half for each subsequent stage.

In the reference channel 170, a reference charge injecting circuit 174 for injecting a charge equal to the MSB of charge is coupled to the first stage charge well 172, a reference charge injecting circuit 173 for injecting a charge equal to one half of the most MSB of charge is coupled to the charge well 174 and a reference charge injecting circuit 177 for injecting a charge equal to one fourth of the MSB of charge is coupled to the charge well 176, as shown. A digital output channel 190 is provided in which a series of charge cells corresponding to the first, second and third stages form a bit charge channel 194, 196, 198 for each output bit of the A/D converter from the MSB to the least significant bit (LSB), as shown. A charge injection circuit 202, 204, 206 is coupled respectively to the first location of each charge channel 194, 196, 198, as shown, through a respective switch 208, 210, 212. Each of the switches 208, 210, 212 are coupled respectively to and controlled by the comparators 186, 184, 182. The same basic structure is repeated for additional stages with the reference charges decreased by one half for each subsequent stage. If the input signal is not a sampled charged signal, optional charge sampling circuitry 214 (e.g. a sampling voltage to charge converter) may be coupled to the input 161 of the first stage of the signal channel 160.

In operation, a sample charge is coupled to the input 161 of the A/D converter 150 and is coupled into the first stage signal channel charge well 162. This charge is compared by the latching comparator 182 to the charge equal to the MSB of charge which is injected into the reference channel charge well 172. If the input signal charge is greater than the MSB reference charge then the unit of charge (Q=1) is switched into the MSB charge cell 192 of the MSB channel 198 in the digital channel 190 from the injection circuit 206 by a control signal from the latching comparator 182 controlling the switch 112 thereby setting the MSB. In addition, the switch 165 will be opened by the comparator 182 preventing the charge from the circuit 163 from being added to the input signal charge. If the input signal charge is less than the MSB reference charge, no unit charge is introduced to the MSB channel 198 because the comparator 182 opens the switch 112 but the switch 165 is closed by the comparator 182 thereby adding a charge equal to the MSB of charge to the input signal charge on the next clock cycle.

Once the signals settle, on the next clock cycle, all charge values are advanced one stage. Thus, the input signal charge in the charge well 162 is advanced to the charge well 164, the charge in the charge well 172 is advanced to the charge well 174, and the charge in the first charge well in the MSB digital channel 198 advances to the next stage charge cell 193. In addition, the next input signal charge sample is input into the first stage charge well 162, the MSB charge from the circuit 163 is added to the signal charge in the charge well 164 if the switch 165 has been closed by the latching comparator 182, one half of the MSB of charge is added to the reference charge in the second reference charge well 174, and the MSB of charge is loaded into the first stage reference charge well 172. All the charge increments in the charge injection circuits are also refreshed.

During this second cycle the first stage repeats operation as previously described on the next input signal charge packet while the original input signal charge is now in the second stage charge well 174, wherein the MSB increment charge may have been added if the switch 165 was closed. This sum of charge is compared to one and a half of the MSB of charge in the reference charge well 174 and the result is latched by the latching comparator 184. In a manner similar to the first stage, if the signal charge sum in charge well 167 is greater than the reference sum in charge well 174, the latching comparator 184 will close the switch 210 and open the switch 169 so that the unit charge is introduced into the next bit level 196 (i.e. MSB minus one) of the digital channel 190 and so that no charge will be added to the input signal charge at the next stage. If the signal charge sum is less than the reference sum, the switch 210 will be opened and the switch 169 will be closed to add one half of the MSB of charge to the input signal charge and so that no charge is introduced into the digital channel 196. Conversion then proceeds in the following stages in the same manner through all stages for full conversion. The result is that both the original sampled analog signal and the reference tend toward full scale while a parallel binary word representing the original signal in digital form is developed and output on the output digital channel 220.

FIG. 5 is a block diagram illustrating a specific embodiment of an eleven bit charge mode floating point A/D converter according to FIG. 1 utilizing the structures of FIGS. 3 and 4. An input signal channel 240 fabricated with divide-by-two charge wells and exponent registers 241 configured as shown in FIG. 3 forms a three bit exponent converter 12. A signal channel 242, a reference channel 244, comparators 246, and digital channel 248 configured as illustrated in FIG. 4 form as eight bit mantissa converter 14. The reference channel 246 of the mantissa converter 14 can also provide the full scale (FS) reference for the exponent converter 12, as shown. The signal output of the exponent converter 12 is coupled directly into the signal input of the signal channel 242 of the mantissa converter 14, as shown. The outputs of the exponent registers 241 and the digital output channel 248 flow is parallel to provide the three bit exponent output 250 and an eight bit mantissa output 252. These outputs provide an eleven bit floating point digital output.

Specific embodiments of the novel floating point analog to digital converter have been described for the purpose of illustrating the manner in which the invention may be made and used. It should be understood that implementation of other variations and modifications of the invention in it's various aspects will be apparent to those skilled in the art and that the invention is not limited by the specific embodiments described. It is therefore contemplated to cover by the present invention any and all modifications, variations or equivalents that fall within the true spirit and scope of the underlying principles disclosed and claimed herein.

What is claimed is:

1. A floating point analog to digital converter comprising:
   a exponent converter for dividing an input signal by a division factor selected responsive to the magnitude of the input signal to generate a divided signal and for generating a digital exponent representation of the division factor;
   a mantissa analog to digital converter coupled to the exponent converter which converts the divided signal to an output digital signal representative of the divided signal;
   output means for outputting both the output digital signal and the digital exponent.

2. The floating point analog to digital converter of claim 1 wherein the exponent converter is a charge mode exponent converter.

3. The floating point analog to digital converter of claim 2 wherein the mantissa analog to digital converter is a charge mode analog to digital converter.

4. A floating point analog to digital converter comprising:
   a charge mode exponent converter for scaling an input signal by a selected factor selected responsive to the magnitude of the input signal to generate a scaled signal and for generating a digital exponent representative of the selected factor;
   a mantissa analog to digital converter coupled to the exponent converter which converts the sealed signal into an output digital signal representative of the scaled signal;
   output means for outputting both the output digital signal and the digital exponent.

5. The floating point analog to digital converter of claim 4 wherein the mantissa analog to digital converter is a charge mode analog to digital converter.

6. A charge mode signal converter comprising:
   input means for input of a signal input charge;
   a series coupled plurality of controlled charge scaling elements, coupled to the input means, each of the charge scaling elements adapted to be activated to scale a charge input to the scaling element by a selected factor;
   control means for sensing the magnitude of the signal input charge and for controlling the charge scaling element to scale the signal input charge by a scaling factor selected responsive to the magnitude of the signal input charge to generate a scaled charge;
   means for generating a digital exponent representative of the scaling factor;
   means for output of the scaled charge and the digital exponent.

7. The charge mode signal converter of claim 6 wherein the charge scaling elements comprise charge splitters, the scaled charge is a divided charge, and the scaling factor is a division factor.

8. The charge mode signal converter of claim 7 wherein the series coupled charge splitters comprise a charge coupled device channel.

9. The charge mode signal converter of claim 7 further comprising a mantissa analog to digital converter coupled to the means for output which converts the divided charge into an output digital signal representative of the divided charge.

10. The charge mode signal converter of claim 7 wherein each of the charge splitters comprise a charge well divided into two parts, one of which is coupled to a selectively activatable charge sink.

11. The charge mode signal converter of claim 9 wherein the mantissa analog to digital converter is a charge mode linear analog to digital converter.

12. The charge mode signal converter of claim 10 wherein the control means comprises a plurality of comparators which selectively control activation of the charge sinks responsive to the magnitude of signal input charge.

13. The charge mode signal converter of claim 12 wherein the means for generating a digital exponent comprises a digital register array having digital data selectively loaded responsive to the comparators.

14. The charge mode signal converter of claim 10 wherein the charge splitters divide the charge by a factor of two.

* * * * *